(12) United States Patent
Pan

(10) Patent No.: US 10,291,230 B2
(45) Date of Patent: May 14, 2019

(54) LEVEL SHIFTER AND LEVEL SHIFTING METHOD

(71) Applicant: TAIWAN SEMICONDUCTOR MANUFACTURING CO., LTD., Hsinchu (TW)

(72) Inventor: Lei Pan, Shanghai (CN)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 15/700,033

(22) Filed: Sep. 8, 2017

(65) Prior Publication Data

US 2018/0287615 A1 Oct. 4, 2018

(30) Foreign Application Priority Data

Mar. 29, 2017 (CN) .......................... 2017 1 0197012

(51) Int. Cl.
| | |
|---|---|
| *H03L 5/00* | (2006.01) |
| *H03K 19/177* | (2006.01) |
| *H03K 19/017* | (2006.01) |
| *H03K 19/0185* | (2006.01) |
| *H02M 3/07* | (2006.01) |
| *H03K 3/356* | (2006.01) |
| *H03K 3/0233* | (2006.01) |

(52) U.S. Cl.
CPC ........ *H03K 19/17784* (2013.01); *H02M 3/07* (2013.01); *H03K 3/02335* (2013.01); *H03K 3/356* (2013.01); *H03K 3/35613* (2013.01); *H03K 3/356182* (2013.01); *H03K 19/01714* (2013.01); *H03K 19/018528* (2013.01)

(58) Field of Classification Search
CPC ............... H03K 3/02335; H03K 3/356; H03K 3/35613; H03K 19/01714; H03K 19/018528; H03K 19/17784; H02M 3/07
See application file for complete search history.

(56) References Cited

U.S. PATENT DOCUMENTS

| | | | | |
|---|---|---|---|---|
| 6,642,769 B1 * | 11/2003 | Chang | .............. | H03K 3/356113 326/68 |
| 6,873,186 B2 | 3/2005 | Gion | | |
| 7,663,423 B1 | 2/2010 | Cheng | | |
| 7,696,805 B2 * | 4/2010 | Thorp | ................ | H03K 3/35613 326/68 |
| 8,643,425 B2 * | 2/2014 | Chaudhry | ........ | H03K 3/356182 327/306 |
| 9,214,925 B2 * | 12/2015 | Lee | .................. | H03K 3/356121 |
| 9,859,894 B1 * | 1/2018 | Chou | ............. | H03K 19/018528 |

(Continued)

*Primary Examiner* — Alexander H Taningco
*Assistant Examiner* — Kurtis R Bahr
(74) *Attorney, Agent, or Firm* — Hauptman Ham, LLP

(57) ABSTRACT

A level shifter includes a level switching circuit, an input circuit, and a first voltage drop circuit. The level switching circuit is configured to adjust a first voltage level of a first node and a second voltage level of a second node in response to a first input signal and a second input signal. The input circuit is configured to receive the first input signal and the second input signal. The first voltage drop circuit is coupled between the level switching circuit and the input circuit, and is configured to track a voltage level of a third node which is coupled to the first node, in order to be turned on according to the voltage level of the third node.

20 Claims, 6 Drawing Sheets

(56) References Cited

U.S. PATENT DOCUMENTS

| | | | |
|---|---|---|---|
| 2006/0033549 A1* | 2/2006 | Huang | H03K 3/356113 327/333 |
| 2008/0204077 A1* | 8/2008 | Huang | H03K 3/35613 326/80 |
| 2012/0056656 A1* | 3/2012 | Chen | H03K 3/35613 327/333 |
| 2016/0211847 A1* | 7/2016 | Duby | H03K 3/35613 |

* cited by examiner

LEVEL SHIFTER AND LEVEL SHIFTING METHOD

PRIORITY CLAIM AND CROSS-REFERENCE

This application claims priority to China Application Serial Number 201710197012.1 filed Mar. 29, 2017, which is herein incorporated by reference.

BACKGROUND

A level shifter is commonly used in an integrated circuit. For example, in some applications, the level shifter is arranged between an input/output (I/O) circuit and a core circuit of an electronic device (e.g., memory device). With the development of the process technology, the operating voltage of the core circuit becomes lower, and the operating voltage of the core circuit is thus lower than the operating voltage of the I/O circuit. Accordingly, before a signal is transmitted from the core circuit to the I/O circuit, a voltage level of the signal is able to be increased by the level shifter. Alternatively, before a signal is transmitted from the I/O circuit to the core circuit, a voltage level of the signal is able to be decreased by the level shifter.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
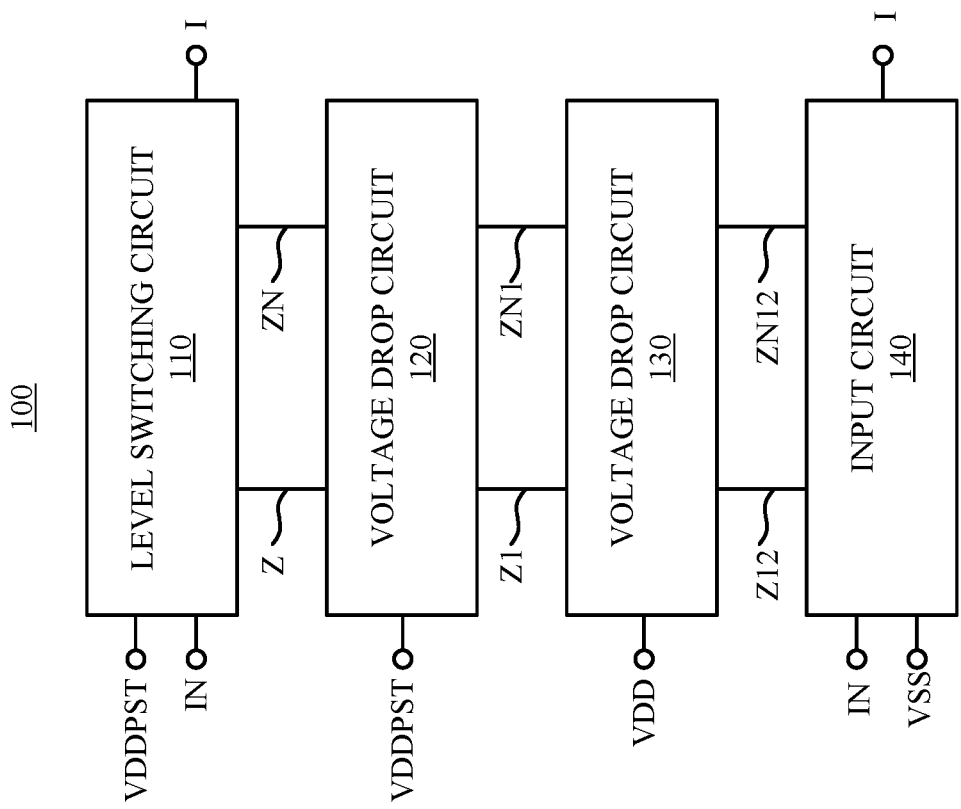
FIG. 1 is a schematic diagram of an electronic device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Reference is now made to FIG. 1. FIG. 1 is a schematic diagram of an electronic device 100, in accordance with some embodiments of the present disclosure. In some embodiments, the electronic device 100 operates as a voltage level shifter.

As illustratively shown in FIG. 1, the electronic device 100 includes a level switching circuit 110, a voltage drop circuit 120, a voltage drop circuit 130, and an input circuit 140. The level switching circuit 110 is configured to adjust a voltage level of a node Z and a voltage level of a node ZN in response to an input signal IN and an input signal I.

In some embodiments, the input signal IN and the input signal I have complementary voltage levels. For example, when the input signal IN is at a logic high level (e.g., a level of voltage VDD), the input signal I is at a logic low level (e.g., a level of voltage VSS). Alternatively, when the input signal IN is at the logic low level, the input signal I is at the low high level. In some embodiments, the electronic device 100 further includes an inverter (not shown). The inverter is configured to generate one of the input signal IN and the input signal I based on another one of the input signal IN and the input signal I.

In this example, when the voltage level of the input signal IN is at the logic high level, the voltage level of the node Z is pulled down to the level of the voltage VSS, and the voltage level of the node ZN is pulled up to the level of voltage VDDPST. When the voltage level of the input signal IN is at the logic low level, the voltage level of the node Z is pulled up to the level of the voltage VDDPST, and the voltage level of the node ZN is pulled down to the level of the voltage VSS. In some embodiments, the node ZN or the node Z operates as an output terminal of the level shifter.

In some embodiments, the voltage VDDPST is a voltage used for a post-driver stage, or a voltage supply to an electrostatic discharge (ESD) protection device in an input/output (I/O) interface. In some embodiments, the voltage VDD is a voltage for a pre-driver. In some embodiments, the voltage VSS is a system slow voltage (e.g., a ground voltage). In some embodiments, the voltage VDDPST is higher than the voltage VDD, and the voltage VDD is higher than the voltage VSS. In some advanced technology (which includes, for example, 16 nm/10 nm/7 nm technology or later), the voltage VDDPST usually is higher than the voltage VDD. In some examples, the voltage VDDPST is about 1.8 Volts, and the voltage VDD is about 0.45 Volts.

The values of the voltage VDDPST, the voltage VDD, and the voltage VSS are given for illustrative purposes only. Various values of the voltage VDDPST, the voltage VDD, and the voltage VSS are within the contemplated scope of the present disclosure.

The voltage drop circuit 120 is coupled between the nodes Z and ZN and the voltage drop circuit 130. The voltage drop circuit 120 is configured to be turned on based on the voltage VDDPST, and is configured to withstand a voltage drop between the voltage drop circuit 130 and the nodes Z and ZN.

In this document, the term "coupled" may also be termed as "electrically coupled," and the term "connected" may be termed as "electrically connected". "Coupled" and "connected" may also be used to indicate that two or more elements cooperate or interact with each other.

The voltage drop circuit 130 and the voltage drop circuit 120 are coupled at nodes Z1 and ZN1, and are coupled between the voltage drop circuit 120 and the input circuit 140. In some embodiments, the voltage drop circuit 130 operates as a negative feedback circuit. This feedback circuit is configured to be selectively turned on based on voltage levels of the nodes Z1 and ZN1, in order to withstand a voltage drop between the input circuit 140 and the nodes Z1 and ZN1. The circuit arrangements of the voltage drop circuit 130 and related operations thereof are described with reference to FIG. 2 in the following paragraphs.

The input circuit 140 and the voltage drop circuit 130 are coupled to nodes Z12 and ZN12. The input circuit 140 is configured to receive the input signal IN and the input signal I, and to operate with the level switching circuit 110, the voltage drop circuit 120, the voltage drop circuit 130 in response to the input signal IN and the input signal I, in order to adjust voltage levels of the nodes Z and ZN.

Figure 2:
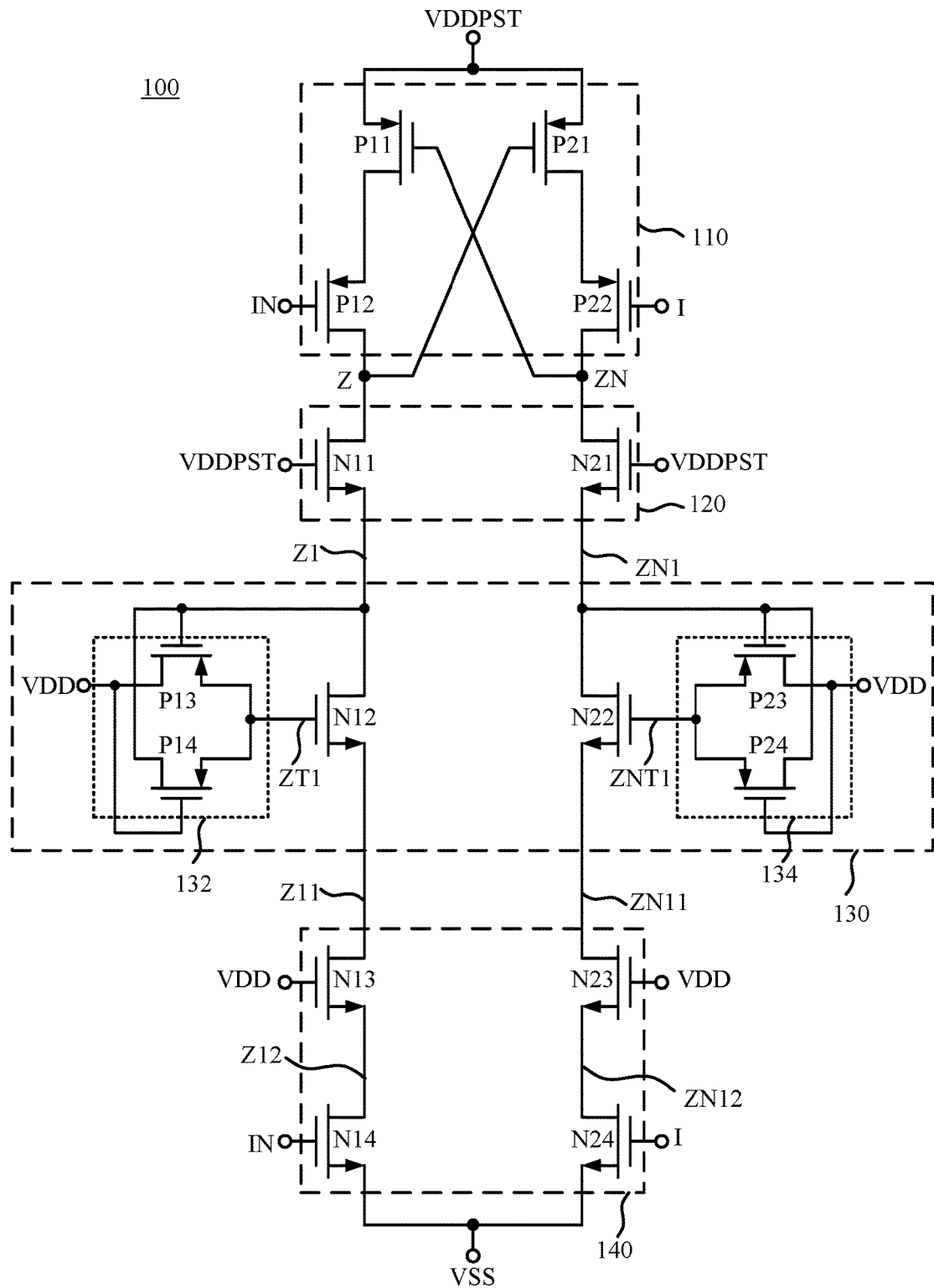
FIG. 2 is a circuit diagram of the electronic device in FIG. 1 in accordance with some embodiments of the present disclosure.

Reference is now made to FIG. 2. FIG. 2 is a circuit diagram of the electronic device 100 in FIG. 1 in accordance with some embodiments of the present disclosure. With respect to FIG. 1, like elements in FIG. 2 are designated with the same reference numbers with respect to FIG. 1 for ease of understanding.

As illustratively shown in FIG. 2, the level switching circuit 110 includes switches P11, P12, P21, and P22. In some embodiments, the switches P11, P12, P21, and P22 are implemented with P-type transistors (e.g., MOSFET). A first terminal of the switch P11 is configured to receive the voltage VDDPST, a second terminal of the switch P11 is coupled to a first terminal of the switch P12, and a control terminal of the switch P11 is coupled to the node ZN. A second terminal of the switch P12 is coupled to the node Z, and a control terminal of the switch P12 is configured to receive the input signal IN. A first terminal of the switch P21 is configured to receive the voltage VDDPST, a second terminal of the switch P21 is coupled to a first terminal of the switch P22, and a control terminal of the switch P21 is coupled to the node Z. A second terminal of the switch P22 is coupled to the node ZN, and a control terminal of the switch P22 is configured to receive the input signal I.

The conductivity type and the transistor type of the switches P11, P12, P21, and P22 of the level switching circuit 110 are given for illustrative purposes only. Various conductivity types and transistor types to implement switches of the level switching circuit 110 are within the contemplated scope of the present disclosure.

The voltage drop circuit 120 includes a switch N11 and a switch N21. In some embodiments, the switch N11 and the switch N21 are implemented with N-type transistors (e.g., MOSFET). A first terminal of the switch N11 is coupled to the node Z, a second terminal of the switch N11 is coupled to the node Z1, and a control terminal of the switch N11 is configured to receive the voltage VDDPST. A first terminal of the switch N21 is coupled to the node ZN, a second terminal of the switch N21 is coupled to the node ZN1, and a control terminal of the switch N21 is configured to receive the voltage VDDPST.

The voltage drop circuit 130 includes a switch N12, a switch N22, a voltage tracking circuit 132, and a voltage tracking circuit 134. In some embodiments, the switch N12 and the switch N22 are implemented with N-type transistors (e.g., MOSFET). A first terminal of the switch N12 is coupled to the node Z1, a second terminal of the switch N12 is coupled to a node Z11, and a control terminal ZT1 of the switch N12 is coupled to the voltage tracking circuit 132. A first terminal of the switch N22 is coupled to the node ZN1, a second terminal of the switch N22 is coupled to a node ZN11, and a control terminal ZNT1 of the switch N22 is coupled to the voltage tracking circuit 134.

The conductivity type and the transistor type of the switches N11, N12, N12, and N22 of the voltage drop circuit 130 are given for illustrative purposes only. Various conductivity types and transistor types to implement switches of the voltage drop circuit 130 are within the contemplated scope of the present disclosure.

The voltage tracking circuit 132 is configured to receive the voltage VDD, and to adjust a voltage level of the control terminal ZT1 of the switch N12 according to the voltage VDD and a voltage level of the node Z1, in order to turn on the switch N12. In some embodiments, the voltage tracking circuit 132 includes a switch P13 and a switch P14. In some embodiments, the switch P13 and the switch P14 are implemented with P-type transistors (e.g., MOSFET). A first terminal of the switch P13 is configured to receive the voltage VDD, and a second terminal of the switch P13 is coupled to the control terminal ZT1 of the switch N12, and a control terminal of the switch P13 is coupled to the node Z1. A first terminal of the switch P14 is coupled to the node Z1, a second terminal of the switch P14 is coupled to the control terminal ZT1 of the switch N12, and a control terminal of the switch P14 is configured to receive the voltage VDD.

The conductivity type and the transistor type of the switches P13 and P14 of the voltage tracking circuit 132 are given for illustrative purposes only. Various conductivity types and transistor types to implement switches of the voltage tracking circuit 132 are within the contemplated scope of the present disclosure.

With the above arrangements, when the input signal IN is at the logic low level, the voltage level of the node Z1 is about equal to the voltage VDDPST minus a threshold voltage (e.g., Vthn in FIG. 3B below) of the switch N11. In some embodiments, as the voltage VDD received by the control terminal of the switch P14 is lower than the voltage level of the node Z1, the switch P14 is turned on. Accordingly, the voltage on the node Z1 is transmitted to the control terminal ZT1. As a result, the voltage level of the control terminal ZT1 is also clamped to a level equal to the voltage VDDPST minus the threshold voltage Vthn of the switch N11. Effectively, the voltage level of the control terminal ZT1 of the switch N12 tracks the voltage level of the node Z1.

Alternatively, when the input signal IN is at the logic high level, the voltage level of the node Z1 is about equal to the voltage VSS. As the voltage VSS received by the control terminal of the switch P13 is lower than the voltage VDD, the switch P13 is turned on to transmit the voltage VDD to the control terminal ZT1 of the switch N12. Accordingly, the switch N12 is turned on to keep the voltage level of the node Z1 being pulled down to the voltage VSS.

The voltage tracking circuit 134 is configured to receive the voltage VDD, and is configured to adjust the voltage level of the control terminal ZNT1 of the switch N22 according to the voltage VDD and the voltage level of the node ZN1, in order to turn on the switch N22. As shown in FIG. 2, the voltage tracking circuit 134 includes a switch P23 and a switch P24. The arrangements of the switch P23 and the switch P24 are similar with the arrangements of the switch P13 and the switch P14, and thus the repetitious descriptions are not given here. The conductivity type and the transistor type of the switches P23 and P24 of the voltage tracking circuit 134 are given for illustrative purposes only. Various conductivity types and transistor types to implement switches of the voltage tracking circuit 134 are within the contemplated scope of the present disclosure.

In some embodiments, various switches in the level switching circuit 110, the voltage drop circuit 120, and the voltage drop circuit 130 are able to be implemented with input/output (I/O) transistors. In some embodiments, the I/O transistors are able to withstand a higher bias voltage (e.g., the voltage VDDPST).

The configurations and the implementations of the switches discussed above are given for illustrative purposes only. Various configurations and implementations of the switches are within the contemplated scope of the present disclosure.

In some embodiments, the input circuit 140 includes switches N13, N14, N23, and N24. In some embodiments, the switches N13, N14, N23, and N24 are implemented with N-type transistors. A first terminal of the switch N13 is coupled to the node Z11, a second terminal of the switch N13 is coupled to the node Z12, and a control terminal of the switch N13 is configured to receive the voltage VDD. A first terminal of the switch N14 is coupled to the node Z12, a second terminal of the switch N14 is configured to receive the voltage VSS, and a control terminal of the switch N14 is configured to receive the input signal VIN. A first terminal of the switch N23 is coupled to the node ZN11, a second terminal of the switch N23 is coupled to the node ZN12, and a control terminal of the switch N23 is configured to receive the voltage VDD. A first terminal of the switch N24 is coupled to the node ZN12, a second terminal of the switch N24 is configured to receive the voltage VSS, and a control terminal of the switch N24 is configured to receive the input signal I.

When the input signal IN is at the logic high level (i.e., the input signal I is at the logic low level), the switch N14 is turned on, and the switch N24 is turned off. Under this condition, the voltage level of the node Z12 is pulled down to the voltage VSS. At the same time, the switch N13 is turned on to pull down the voltage levels of the nodes Z11, Z1, and Z to the voltage VSS. As the voltage level of the node Z is pulled down to the voltage VSS, the switch P21 is turned on. At the same time, the switch P22 is turned on based on the input signal I. As a result, the voltage level of the node ZN is pulled up to the voltage VDDPST.

Alternatively, when the input signal IN is at the logic low level (i.e., the input signal I is at the logic high level), the switch N14 is turned off, and the switch N24 is turned on. Under this condition, the voltage level of the node ZN12 is pulled down to the voltage VSS. At the same time, the switch N23 is turned on to pull down the voltage levels of the nodes ZN11, ZN1, and ZN to the voltage VSS. As the voltage level of the node ZN is pulled down to the voltage VSS, the switch P11 is turned on. At the same time, the switch P12 is turned on based on the input signal IN. As a result, the voltage level of the node Z is pulled up to the voltage VDDPST.

In some embodiments, various switches in the input circuit 140 are able to be implemented with core transistors. In some embodiments, compared with the I/O transistors, the core transistors are able to withstand a lower bias voltage (e.g., the voltage VDD).

The conductivity type and the transistor type of the switches N13, N14, N23, and N24 of the input circuit 140 are given for illustrative purposes only. Various conductivity types and transistor types to implement switches of the input circuit 140 are within the contemplated scope of the present disclosure.

The configurations and implementations of the switches in the input circuit 140 are given for illustrative purposes only. Various configurations and implementations of the switches are within the contemplated scope of the present disclosure.

Figure 3A:
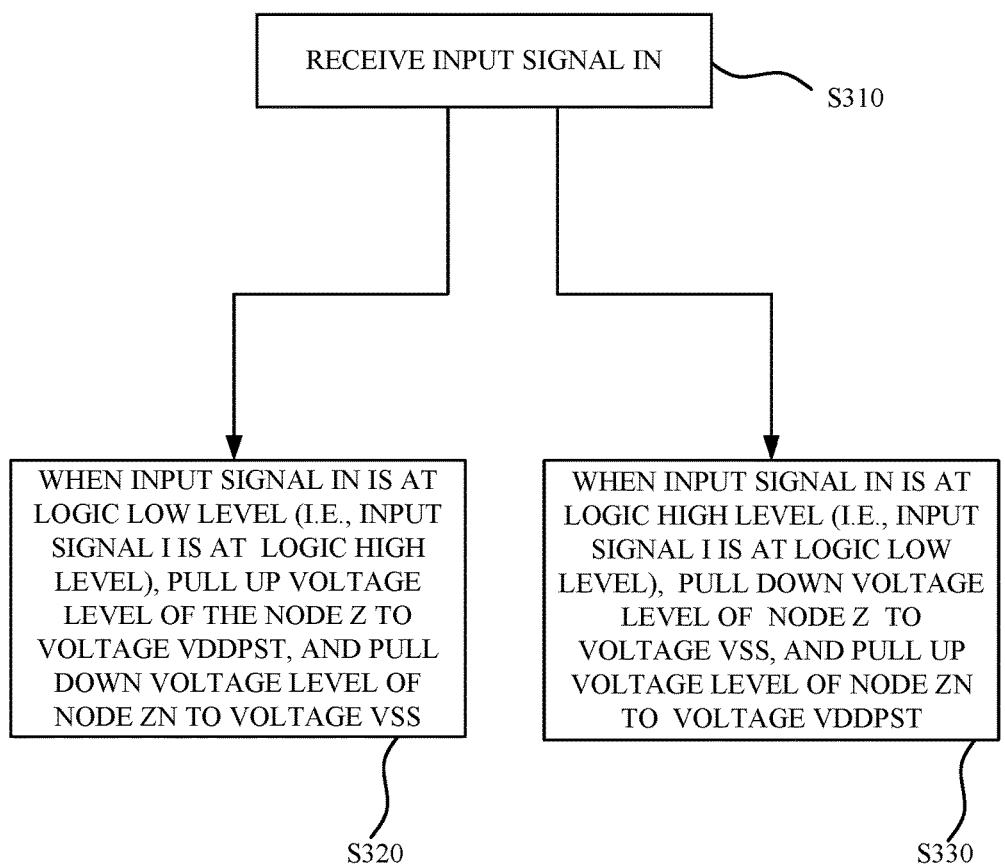
FIG. 3A is a flow chart of a level shifting method, in accordance with some embodiments of the present disclosure.

Reference is now made to FIG. 3A. FIG. 3A is a flow chart of a level shifting method 300, in accordance with some embodiments of the present disclosure. In some embodiments, the method 300 includes operations S310, S320, and S330.

In operation S310, the input signal IN is received. For illustration of FIG. 2, the control terminals of the switches P12 and N14 and the switches P22 and N24 receive the input signal IN and the input signal I, respectively.

In operation S320, when the input signal IN is at the logic low level (i.e., the input signal I is at the logic high level), the voltage level of the node Z is pulled up to the voltage VDDPST, and the voltage level of the node ZN is pulled down to the voltage VSS.

Figure 3B:
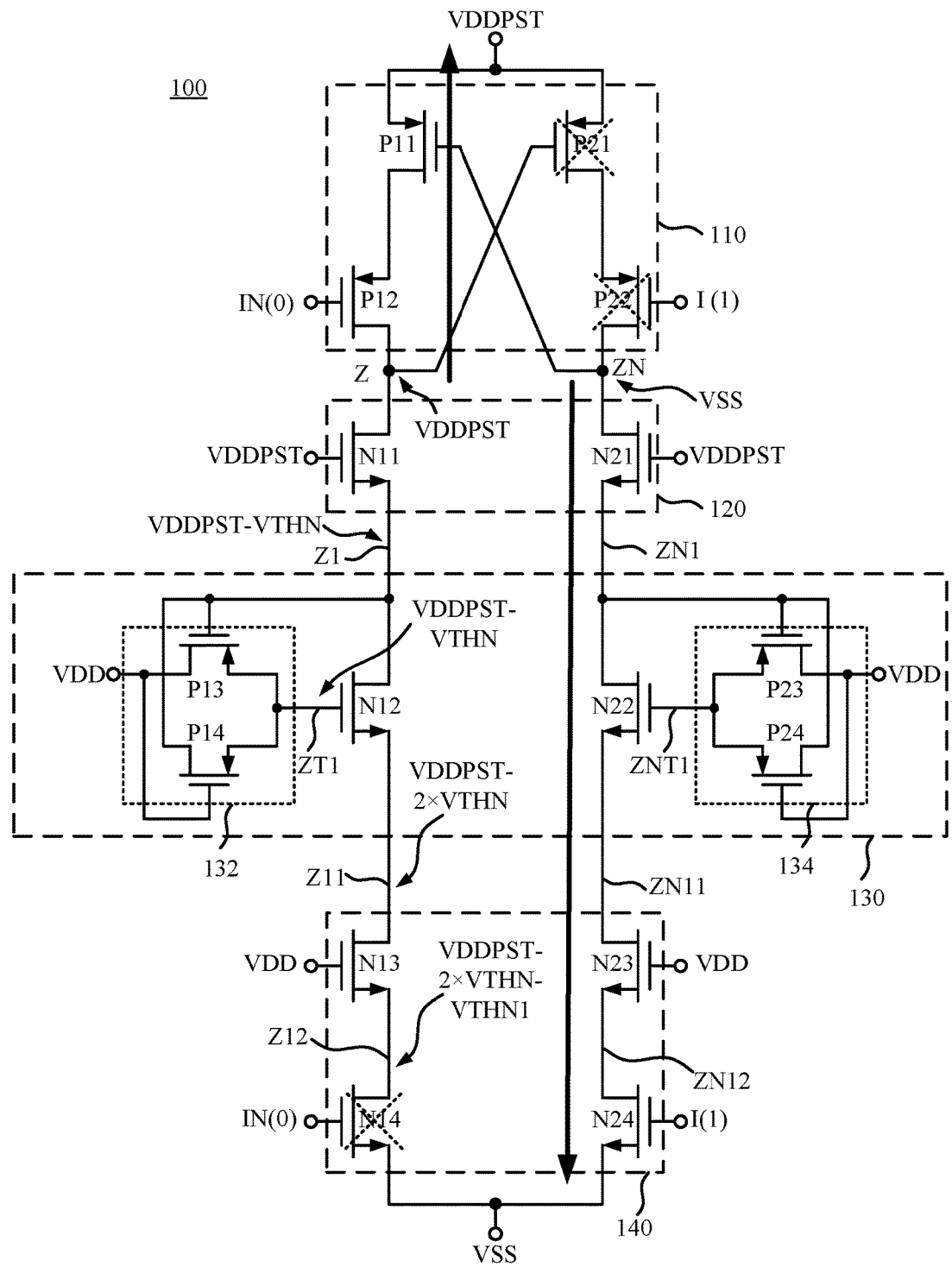
FIG. 3B is a schematic diagram illustrating operation in FIG. 3A performed by the electronic device in FIG. 2, in accordance with some embodiments of the present disclosure.

For illustration of operation S320, reference is now made to FIG. 3B, and operation S330 will be discussed later. FIG. 3B is a schematic diagram illustrating operation S320 in FIG. 3A performed by the electronic device 100 in FIG. 2, in accordance with some embodiments of the present disclosure. With respect to FIG. 2, like elements in FIG. 3B are designated with the same reference numbers for ease of understanding.

As illustratively shown in FIG. 3B, on condition that the input signal IN is at the logic low level (indicated as "0") and that the input signal I is at the logic high level (indicated as "1"), the switch P12 and the switch N24 are turned on, and the switch P22 and the switch N14 are turned off. As the switch N24 is turned on, the path present between the switch N21, the switch N22, and the switch N23 is turned on. As a result, the voltage level of the node ZN is pulled down to the voltage VSS via the switches N21-N24.

Then, as the voltage level of the node ZN is about equal the voltage VSS, the switch P11 is turned on. As the switch N14 is turned off, the path present between the switches N11-N14 are turned off. Accordingly, the voltage level of the node Z is pulled up to the voltage VDDPST via the switches P11-P12. As the voltage level of the node Z is the voltage VDDPST, the switch P21 is turned off.

With the above operations, when receiving the input signal IN having the logic low level, a signal having a level of the voltage VDDPST is outputted from the node Z. Effectively, the level of the input signal IN is shifted from a lower level (i.e., voltage VSS) to a higher level (i.e., voltage VDDPST).

During the above operations, as shown in FIG. 3B, the voltage level of the node Z is about equal to the voltage VDDPST, the voltage level of the node Z1 is about equal to the voltage VDDPST minus the threshold voltage VTHN of the switch N11. As mentioned above, with the voltage tracking circuit 132, the voltage level of the control terminal ZT1 of the switch N12 tracks the voltage level of the node Z1. In other words, the voltage level of the ZT1 is also about equal to the voltage VDDPST minus the threshold voltage VTHN of the switch N11. Hence, the voltage level of the node Z11 is about equal to the voltage VDDPST minus the threshold voltages VTHN of the switches N11 and N12. The voltage level of the node Z12 is about equal to the voltage VDDPST minus the twice threshold voltage VTHN and minus the threshold voltage VTHN1 of the switch N13.

In some other approaches different from those of the present disclosure, native transistors are employed to implement a level shifter for low voltage applications. The native transistors are transistors having a nearly-zero threshold voltage, and thus are suitable for operating in the low voltage applications. In the example where the voltage VDDPST configured as 1.8 Volts, considering the process, the voltage, the temperature, impacts from parasitic resistors and/or capacitors, and operation speed, a voltage across between first terminal and second terminal of the core transistors (e.g., the switch N14 and N24) is about 0.9 Volts. Compared with these approaches, with arrangements of the electronic device 100, the electronic device 100 is able to be used in the low voltage application without employing the native transistors while the voltage across the first terminal and second terminal of the switch in the electronic device 100 is reduced. In other words, a voltage stress between the two terminals of the transistor is reduced. As a result, the reliability of the electronic device 100 is kept. For example, in some embodiments, the voltage across the two terminals of the switch N13 is only about 0.774 Volts. The value given above is for illustrative purposes only. Various values of applied voltage are within the contemplated scope of the present disclosure.

With continued reference to FIG. 3A, in operation S330, when the input signal IN is at the logic high level (i.e., the input signal I is at the logic low level), the voltage level of the node Z is pulled down to the voltage VSS, and the voltage level of the node ZN is pulled up to the voltage VDDPST.

Figure 3C:
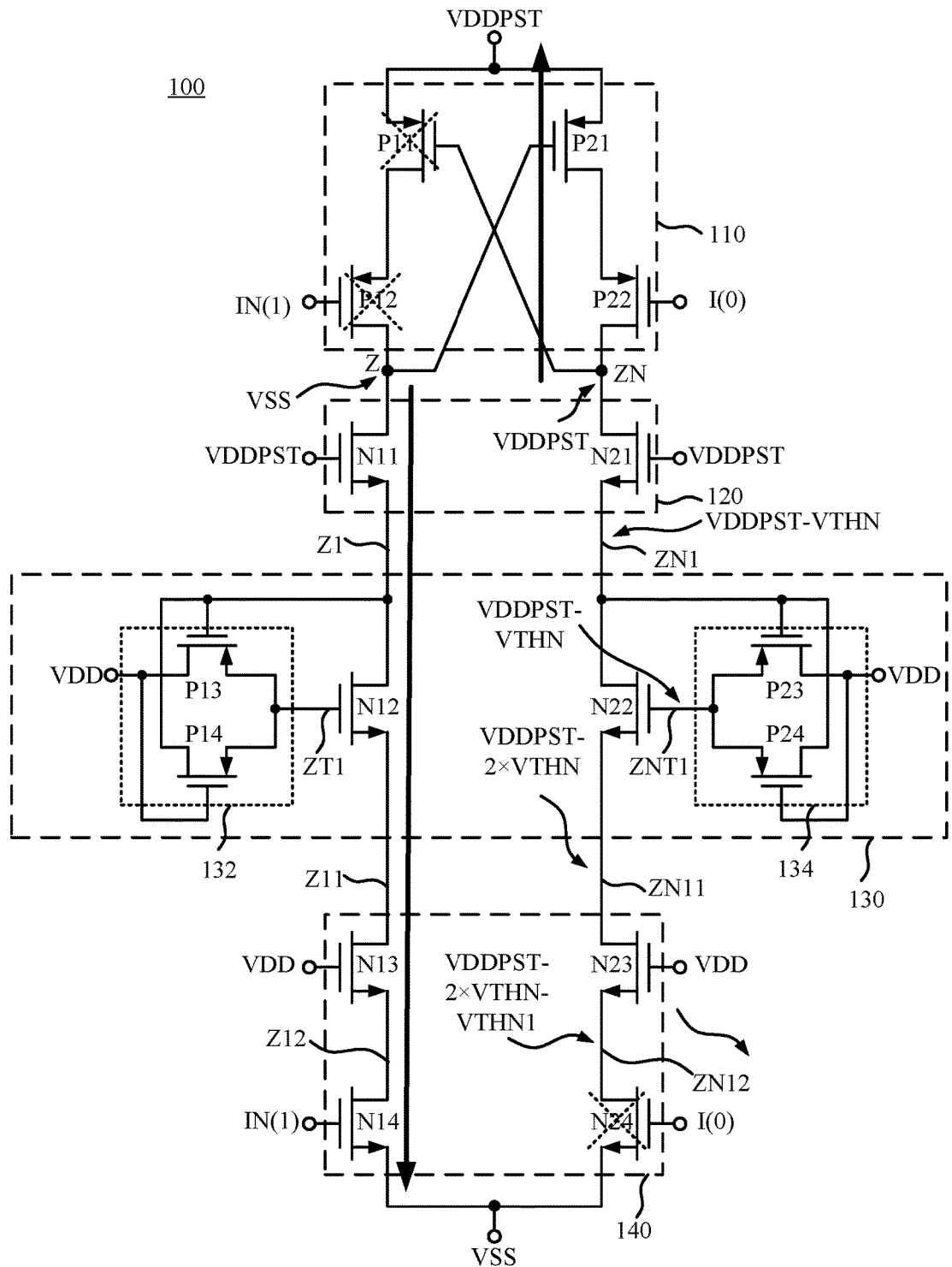
FIG. 3C is a schematic diagram illustrating operation in FIG. 3A performed by the electronic device in FIG. 2, in accordance with some embodiments of the present disclosure.

For illustration, reference is made to FIG. 3C, and FIG. 3C is a schematic diagram illustrating operation S330 in FIG. 3A performed by the electronic device 100 in FIG. 2, in accordance with some embodiments of the present disclosure. With respect to FIG. 2, like elements in FIG. 3C are designated with the same reference numbers for ease of understanding.

As illustratively shown in FIG. 3C, on condition that the input signal IN is at the logic high level (indicated as "1") and the input signal I is at the logic low level (indicated as "0"), the switch P12 and the switch N24 are turned off, and the switch P22 and the switch N14 are turned on. As the switch N14 is turned on, the path present between the switch N11, the switch N12, and the switch N13 is turned on. As a result, the voltage level of the node Z is pulled down to the voltage VSS via the switches N11-N14.

Then, as the voltage level of the node Z is about equal to the voltage VSS, the switch P21 is turned on. As the switch N24 is turned off, the path coupling between the switches N21-N24 is turned off. Accordingly, the voltage level of the node ZN is pulled up to the voltage VDDPST via the switches P21-P22. As the voltage level of the node ZN is about equal to the voltage VDDPST, the switch P11 is turned off. With the above operations, when receiving the input signal I having the logic high level, a signal having a level of the voltage VDDPST is outputted from the node Z. Effectively, the level of the input signal IN is shifted from a higher level (i.e., the voltage VDDPST) to a lower level (i.e., the voltage VSS).

The above description of the method 300 includes exemplary operations, but the operations of the method 300 are not necessarily performed in the order described. The order of the operations of the method 300 disclosed in the present disclosure are able to be changed, or the operations are able to be executed simultaneously or partially simultaneously as appropriate, in accordance with the spirit and scope of various embodiments of the present disclosure.

In some embodiments, bulk terminals (not shown) of the switches P11, P12, P21, and P22 are configured to receive the voltage VDDPST, and bulk terminals (not shown) of the switches N11, N12, N13, and N14 are configured to receive the voltage VSS. In some embodiments, bulk terminals (not shown) of the switches P13, P14, P23, and P24 are configured to receive the voltage VDDPST. In some embodiments, the bulk terminals of the switches P13, P14, P23, and P24 are configured to receive the voltage VDD. A threshold voltage of the switches N11, N12, N13, and N14 is reduced if a bulk voltage of these switches is reduced, and a threshold voltage of the switches P13, P14, P23, and P24 is reduced if a bulk voltage of these switches is increased. Therefore, with the arrangements above, the bulk terminals (not shown) of the switches N11, N12, N13, and N14 receives the lowest voltage VSS, the bulk terminals (not shown) of the switches P13, P14, P23, and P24 receives a high voltage VDD or the highest voltage VDDPST. As a result, the threshold voltage of these switches is able to be reduced, and thus these switches are able to be strongly turned off. Accordingly, leakage currents of these switches are able to be reduced.

Figure 4:
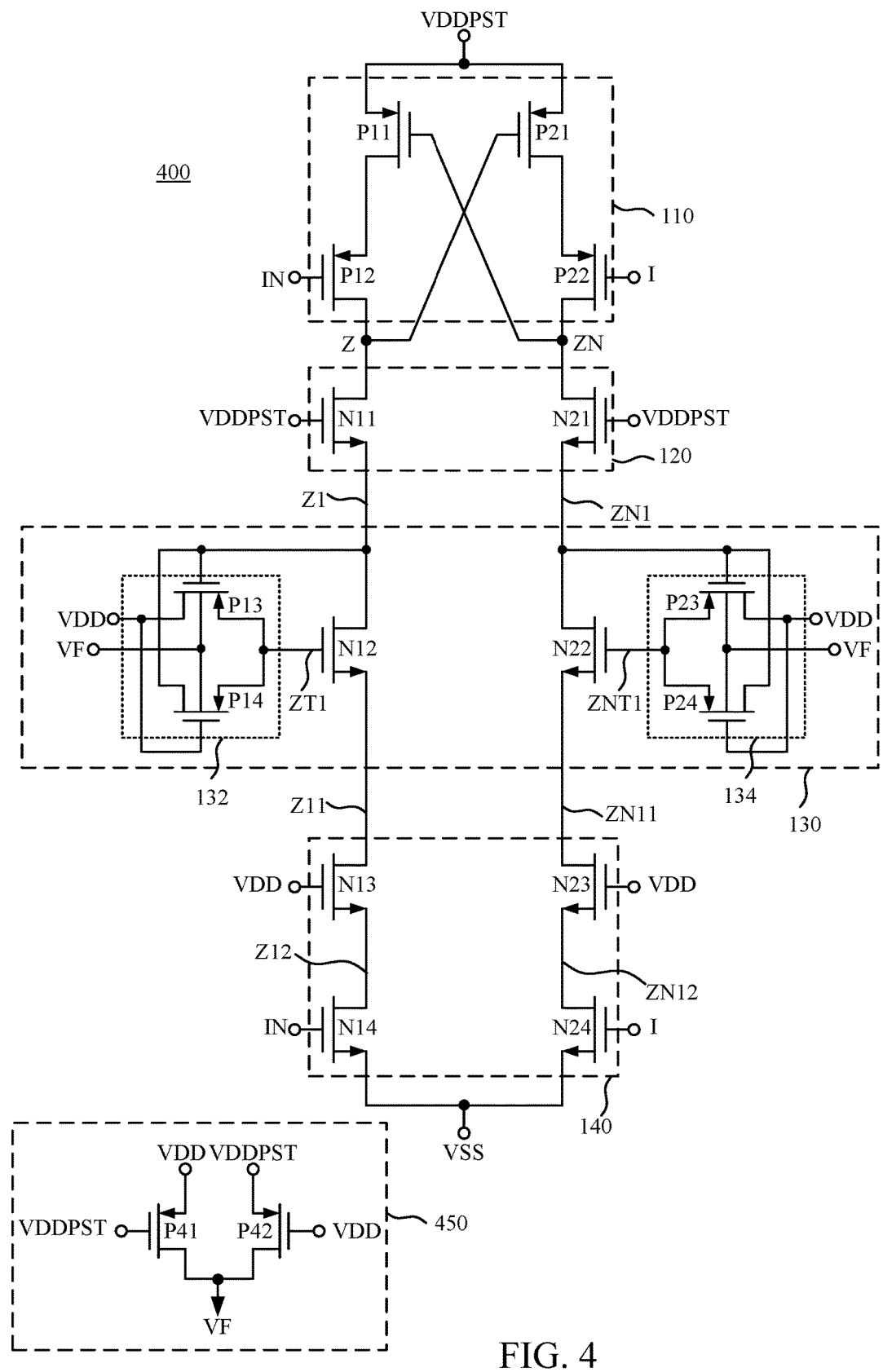
FIG. 4 is a circuit diagram of an electronic device, in accordance with some embodiments of the present disclosure.

The bias configurations for the bulk terminals of the switches are given for illustrative purposes only. Various bias configurations are within the contemplated scope of the present disclosure. Reference is now made to FIG. 4. FIG. 4 is a circuit diagram of an electronic device 400, in accordance with some embodiments of the present disclosure. With respect to FIG. 3, like elements in FIG. 4 are designated with the same reference numbers for ease of understanding.

Compared with the electronic device 100 in FIG. 2, the electronic device 400 in FIG. 4 further includes a bias circuit 450. The bias circuit 450 is configured to provide a bias voltage VF to bulk terminals of the switches P13, P14, P23, and P24 based on the voltage VDD and the voltage VDDPST, in order to provide a higher one of the voltage VDD and the voltage VDDPST. For example, during the operations of the electronic device 100, the voltage VDDPST is powered on earlier than the voltage VDD is. Under this condition, the bias circuit 450 outputs the voltage VDDPST as the bias voltage VF, and transmits the same to the bulk terminals of the switches P13, P14, P23, and P24. In other words, the bulk terminals of the switches P13, P14, P23, and P24 receive the highest voltage at present in the system. As a result, the leakage currents of the switches P13, P14, P23, and P24 are able to be reduced.

In some embodiments, the bias circuit 450 includes a switch P41 and a switch P42. In some embodiments, the switches P41 and P42 are implemented with I/O transistors. In some embodiments, a first terminal of the switch P41 is configured to receive the voltage VDD, a second terminal of the switch P41 is configured to output the bias voltage VF, and a control terminal of the switch P41 is configured to receive the voltage VDDPST. A first terminal of the switch P42 is configured to receive the voltage VDDPST, a second terminal of the switch P42 is configured to output the bias voltage VF, and a control terminal of the switch P42 is configured to receive the voltage VDD. In operation, the switch P41 is configured to be turned on according to the voltage VDDPST, in order to output the voltage VDD as the bias voltage VF. As a result, when the voltage VDD is powered on before the voltage VDDPST, the switch P41 is turned on to output the voltage VDD as the bias voltage VF. The switch P42 is configured to be turned on according to the voltage VDD, in order to output the voltage VDDPST as the bias voltage VF. As a result, when the voltage VDDPST is powered on before the voltage VDD, the switch P42 is turned on to output the voltage VDDPST as the bias voltage VF.

The arrangements of the bias circuit 450 are given for illustrative purposes only. Various arrangements able to perform the corresponding functions of the bias circuit 420 are within the contemplated scope of the present disclosure.

The numbers of the voltage drop circuits 120 and 130 shown in each figure are given for illustrative purposes only. The numbers of the voltage drop circuits 120 and 130 used in the electronic device 100 are able to be adjusted with different voltages. Accordingly, various numbers of the voltage drop circuits 120 and 130 are within the contemplated scope of the present disclosure. In addition, types of the transistors shown in each figure are given for illustrative purposes only. Various transistors able to implement switches are within the contemplated scope of the present disclosure.

As described above, the electronic device and the level shifting method provided in the present disclosure are able to be applied, without using native transistors, in a low voltage application, and keep the reliability of the device.

In some embodiments, a level shifter is disclosed that includes a level switching circuit, an input circuit, and a first voltage drop circuit. The level switching circuit is configured to adjust a first voltage level of a first node and a second voltage level of a second node in response to a first input signal and a second input signal. The input circuit is configured to receive the first input signal and the second input signal. The first voltage drop circuit is coupled between the level switching circuit and the input circuit, and is configured to track a voltage level of a third node which is coupled to the first node, in order to be turned on according to the voltage level of the third node.

Also disclosed is a level shifter that includes a level switching circuit, a first voltage drop circuit, a second voltage drop circuit, and an input circuit. The level switching circuit is coupled to a first node and a second node. The first voltage drop circuit is coupled to the first node and the second node, the first voltage drop circuit configured to be turned on based on a first voltage. The second voltage drop circuit and the first voltage drop circuit are coupled at a third node and a fourth node. The second voltage drop circuit is configured to be turned on based on a second voltage or a voltage level of the third node or the fourth node, in which the second voltage is different from the first voltage. The input circuit is coupled to the second voltage drop circuit, and is configured to, based on a first input signal and a second input signal, operate with the level switching circuit, the first voltage drop circuit, and the second voltage drop circuit to adjust a first voltage level of the first node and a second voltage level of the second node.

Also disclosed is a level shifting method that includes operations as follows: receiving, by an input circuit, a first input signal and a second input signal; adjusting, by a level switching circuit, a first voltage level of a first node and a second voltage level of a second node in response to the first input signal and the second input signal; and tracking, by a voltage drop circuit, a voltage level of a third node, which is coupled to the first node, in order to turn on the voltage drop circuit according to the voltage level of the third node, in which the voltage drop circuit is coupled between the input circuit and the level switching circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A level shifter, comprising:
   a level switching circuit configured to adjust a first voltage level of a first node and a second voltage level of a second node in response to a first input signal and a second input signal;
   an input circuit configured to receive the first input signal and the second input signal;
   a first voltage drop circuit coupled between the level switching circuit and the input circuit, the first voltage drop circuit configured to track a voltage level of a third node which is coupled to the first node, in order to be turned on according to the voltage level of the third node; and
   a bias circuit coupled to the first voltage drop circuit, and configured to output a bias voltage to the first voltage drop circuit according to a first voltage and a second voltage, the second voltage being different from the first voltage.

2. The level shifter of claim 1, wherein the level switching circuit comprises:
   a first switch configured to be turned on according to the second voltage level, in order to transmit the first voltage;
   a second switch coupled between the first switch and the first node, the second switch configured to be turned on according to the first input signal;
   a third switch configured to be turned on according to the first voltage level, in order to transmit the first voltage; and
   a fourth switch coupled between the third switch and the second node, the fourth switch configured to be turned on according to the second input signal.

3. The level shifter of claim 2, wherein the input circuit comprises:
   a fifth switch coupled to the first voltage drop circuit, the fifth switch configured to be turned on according to the second voltage;
   a sixth switch coupled to the fifth switch, the sixth switch configured to be turned on according to the first input signal, in order to pull down the first voltage level to a third voltage;

a seventh switch coupled to the first voltage drop circuit, the seventh switch configured to be turned on according to the second voltage; and an eighth switch coupled to the seventh switch, the eighth switch configured to be turned on according to the second input signal, in order to pull down the second voltage level to the third voltage.

4. The level shifter of claim 1, wherein the first voltage drop circuit comprises:

a first switch coupled to the third node, the first switch configured to be turned on according to the first voltage;

a second switch coupled between the third node and the input circuit;

a first voltage tracking circuit configured to turn on the second switch according to the voltage level of the third node or the second voltage;

a third switch, the third switch and the level switching circuit coupled at a fourth node, the third switch configured to be turned on according to the first voltage;

a fourth switch coupled between the fourth node and the input circuit; and a second voltage tracking circuit configured to turn on the fourth switch according to a voltage level of the fourth node or the second voltage.

5. The level shifter of claim 4, further comprising:
a second voltage drop circuit wherein
the first switch id coupled between the first node and the third node, and the first switch is configured to be turned on based on the first voltage; and
the third switch is coupled between the second node and the fourth node, and the third switch is configured to be turned on based on the first voltage.

6. The level shifter of claim 4, wherein the first voltage tracking circuit comprises:

a fifth switch configured to be turned on according to the voltage level of the third node, in order to turn on the second switch based on the second voltage; and a sixth switch configured to be turned on according to the second voltage, in order to turn on the second switch based on the voltage level of the third node.

7. The level shifter of claim 6, wherein the
bias voltage is one of the first voltage or the second voltage, and the
bias circuit is further configured to transmit the bias voltage to a bulk terminal of each one of the fifth switch and the sixth switch.

8. The level shifter of claim 1, wherein at least one of the level switching circuit or the first voltage drop circuit is implemented with input/output (I/O) transistors, and the input circuit is implemented with core transistors.

9. A level shifter, comprising:
a level switching circuit coupled to a first node and a second node;
a first voltage drop circuit coupled to the first node and the second node, the first voltage drop circuit configured to be turned on based on a first voltage;
a second voltage drop circuit, the second voltage drop circuit and the first voltage drop circuit coupled at a third node and a fourth node, the second voltage drop circuit configured to be turned on based on a second voltage or a voltage level of the third node or a voltage level of the fourth node, wherein the second voltage is different from the first voltage;
an input circuit coupled to the second voltage drop circuit, the input circuit configured to, based on a first input signal and a second input signal, operate with the level switching circuit, the first voltage drop circuit, and the second voltage drop circuit to adjust a first voltage level of the first node and a second voltage level of the second node; and a bias circuit coupled to the second voltage drop circuit, and configured to output a bias voltage to the second voltage drop circuit according to the first voltage and the second voltage.

10. The level shifter of claim 9, wherein the level switching circuit comprises:

a first switch configured to receive the first voltage and to be turned on according to the second voltage level;

a second switch coupled between the first switch and the first node, the second switch configured to be turned on according to the first input signal;

a third switch configured to receive the first voltage and to be turned on according to the first voltage level; and a fourth switch coupled between the third switch and the second node, the fourth switch configured to be turned on according to the second input signal.

11. The level shifter of claim 9, wherein the first voltage drop circuit comprises:

a first switch coupled between the first node and the third node, the first switch configured to be turned on according to the first voltage; and a second switch coupled between the second node and the fourth node, the second switch configured to be turned on according to the first voltage.

12. The level shifter of claim 11, wherein the second voltage drop circuit comprises:

a third switch coupled between the third node and the input circuit, the third switch configured to be turned on according to the voltage level of the third node or the second voltage; and a first voltage tracking circuit configured to turn on the third switch according to the voltage level of the third node or the second voltage.

13. The level shifter of claim 12, wherein the first voltage tracking circuit comprises:

a fourth switch configured to be turned on according to the voltage level of the third node, in order to turn on the third switch based on the second voltage; and a fifth switch configured to be turned on according to the second voltage, in order to turn on the third switch based on the voltage level of the third node.

14. The level shifter of claim 13, wherein the
bias voltage is one of the first voltage or the second voltage, and the
bias circuit is further configured to transmit the bias voltage to a bulk terminal of each one of the fourth switch and the fifth switch.

15. The level shifter of claim 14, wherein the bias circuit comprises:

a sixth switch configured to be turned on according to the first voltage, in order to output the second voltage as the bias voltage; and a seventh switch configured to be turned on according to the second voltage, in order to output the first voltage as the bias voltage.

16. The level shifter of claim 12, wherein the second voltage drop circuit further comprises:

a fourth switch coupled between the fourth node and the input circuit, the fourth switch configured to be turned on according to the voltage level of the fourth node or the second voltage; and a second voltage tracking circuit configured to turn on the fourth switch according to the voltage level of the fourth node or the second voltage.

17. The level shifter of claim 9, wherein the input circuit comprises:
   a first switch coupled to the second voltage drop circuit, the first switch configured to be turned on according to the second voltage;
   a second switch coupled to the first switch, the second switch configured to be turned on according to the first input signal, in order to pull down the first voltage level to a third voltage;
   a third switch coupled to the second voltage drop circuit, the third switch configured to be turned on according to the second voltage; and
   a fourth switch coupled to the third switch, the fourth switch configured to be turned on according to the second input signal, in order to pull down the second voltage level to the third voltage.

18. The level shifter of claim 9, wherein at least one of the level switching circuit, the first voltage drop circuit, or the second voltage drop circuit is implemented with input/output (I/O) transistors, and the input circuit is implemented with core transistors.

19. A level shifting method, comprising:
   receiving, by an input circuit, a first input signal and a second input signal;
   adjusting, by a level switching circuit, a first voltage level of a first node and a second voltage level of a second node in response to the first input signal and the second input signal;
   tracking, by a voltage drop circuit, a voltage level of a third node, which is coupled to the first node, in order to turn on the voltage drop circuit according to the voltage level of the third node, wherein the voltage drop circuit is coupled between the input circuit and the level switching circuit; and
   outputting, by a bias circuit, a bias voltage to the voltage drop circuit according to a first voltage and a second voltage, the second voltage being different from the first voltage, and the bias circuit being coupled to the voltage drop circuit.

20. The level shifting method of claim 19, wherein tracking the voltage level of the third node comprises:
   turning on a first switch of the voltage drop circuit according to the first voltage, wherein the first switch is coupled to the third node;
   turning on, by a first voltage tracking circuit, a second switch of the voltage drop circuit according to the voltage level of the third node or the second voltage, wherein the second switch is coupled between the first switch and the input circuit;
   turning on a third switch of the voltage drop circuit according to the first voltage, wherein the third switch is coupled to a fourth node; and
   turning on, by a second voltage tracking circuit, a fourth switch of the voltage drop circuit according to a voltage level of the fourth node, wherein the fourth switch is coupled between the third switch and the input circuit.

* * * * *